(12) United States Patent
Mauder

(10) Patent No.: US 9,787,216 B2
(45) Date of Patent: Oct. 10, 2017

(54) FULL-WAVE RECTIFIER

(71) Applicant: Infineon Technologies Austria AG, Villach (AT)

(72) Inventor: Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 343 days.

(21) Appl. No.: 14/138,329

(22) Filed: Dec. 23, 2013

(65) Prior Publication Data

US 2015/0180362 A1    Jun. 25, 2015

(51) Int. Cl.
| | | |
|---|---|---|
| *H02M 7/217* | (2006.01) |
| *H02M 1/42* | (2007.01) |
| *H02M 1/088* | (2006.01) |
| *H02M 7/219* | (2006.01) |
| *H03K 17/687* | (2006.01) |
| *H03K 17/30* | (2006.01) |

(52) U.S. Cl.
CPC .......... *H02M 7/217* (2013.01); *H02M 1/088* (2013.01); *H02M 1/4208* (2013.01); *H02M 7/219* (2013.01); *H03K 17/6872* (2013.01); *H02M 2007/2195* (2013.01); *H03K 2017/307* (2013.01); *H03K 2217/0045* (2013.01); *Y02B 70/1408* (2013.01)

(58) Field of Classification Search
CPC ............... H02M 7/217; H02M 1/4208; H02M 2007/2195; H03K 17/6872

USPC .......................................................... 363/127
See application file for complete search history.

(56) References Cited

U.S. PATENT DOCUMENTS

| 7,782,099 B2 * | 8/2010 | Kawamura .......... H03K 17/302 |
| | | 327/108 |
| 7,791,914 B1 * | 9/2010 | Thakur .................... H02M 1/08 |
| | | 363/127 |
| 9,112,428 B2 * | 8/2015 | Bailey .................... H02M 7/538 |
| 2011/0124310 A1 * | 5/2011 | Theilmann ............... H02J 5/005 |
| | | 455/343.1 |

* cited by examiner

*Primary Examiner* — Adolf Berhane
*Assistant Examiner* — Afework Demisse
(74) *Attorney, Agent, or Firm* — Slater Matsil, LLP

(57) ABSTRACT

A full-wave rectifier is disclosed. In one embodiment the full-wave rectifier includes two input paths configured to receive an alternating input voltage, two output paths configured to provide a direct output voltage, and four switched-mode rectifying paths that are connected between each of the input paths and each of the output paths, wherein the switched mode rectifying paths are configured to connect a first input path to a first output path and a second input path to a second output path during a first half wave of the input voltage, and to connect the first input path to the second output path and the second input path to the first output path during a second half wave of the input voltage, and wherein the switched-mode rectifying paths include cascode circuits.

19 Claims, 3 Drawing Sheets

FULL-WAVE RECTIFIER

TECHNICAL FIELD

The disclosure relates to full-wave rectifiers, in particular to bridge rectifiers.

BACKGROUND

A bridge rectifier is a type of electrical circuit in which four rectifying paths are connected between each of two alternating current (AC) input paths and each of two direct current (DC) output paths to provide the same polarity of output for either polarity of input (half wave). The rectifying paths usually include one or more diodes, which are quite inefficient and considerably affect the overall efficiency of power conversion from AC energy to DC energy. The inefficiency arises from the forward voltages of the diodes, which may be up to 1 volt or more. As at least two diodes are connected in series at any time during operation of a bridge rectifier, the voltage loss caused by the diodes may approximately be between 0.8 and 2.5% in common power supply circuits whose input voltage is somewhere between 85 and 265 volts (V). This inefficiency caused by the diodes is often considered to be too much.

SUMMARY OF THE INVENTION

The full-wave rectifier includes two input paths that are configured to receive an alternating input voltage, two output paths that are configured to provide a direct output voltage and four switched-mode rectifying paths that are connected between each of the input paths and each of the output paths. The switched-mode rectifying paths are configured to connect one input path to one output path and the other input path to the other output path during one half wave of the input voltage, and to connect the first input path to the second output path and the second input path to the first output path during the other half wave of the input voltage. The switched-mode rectifying paths comprise cascode circuits.

BRIEF DESCRIPTION OF THE DRAWINGS

These and other aspects are illustrated in the drawings, in which like referenced numerals designate corresponding parts throughout the different views.

DETAILED DESCRIPTION OF ILLUSTRATIVE EMBODIMENTS

For the sake of simplicity, all transistors used in the exemplary two-wire full-wave rectifiers described below are metal-oxide-semiconductor field-effect transistors, but can be individually substituted by bipolar transistors, junction field-effect transistors, silicon carbide transistors, gallium nitride transistors, or any other appropriate transistors.

Figure 1:
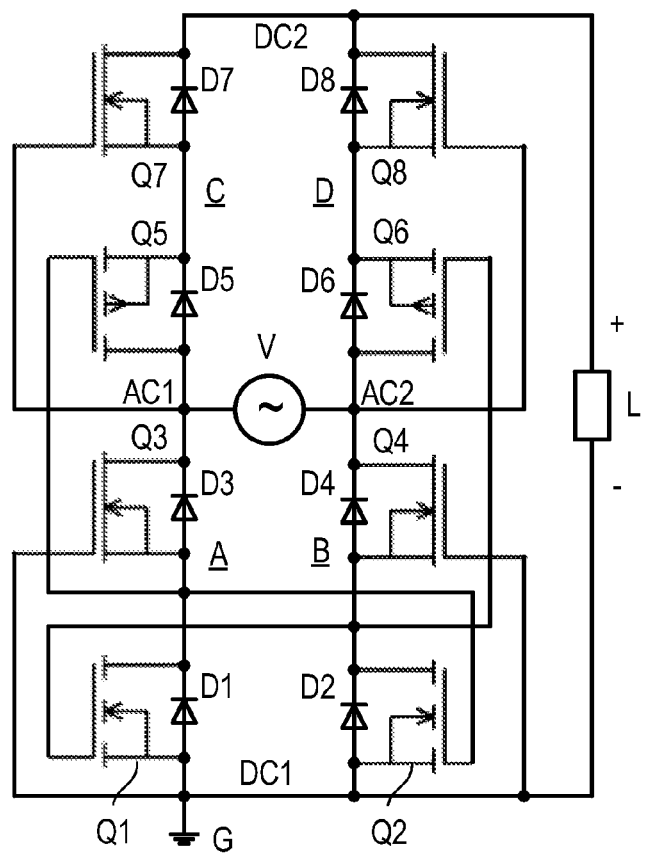
FIG. 1 is a circuit diagram of a full-wave rectifier with two transistors in each rectifying path.

As shown in FIG. 1, an exemplary bridge rectifier includes four rectifying paths A, B, C and D, which are connected between each of two AC input paths AC1 and AC2 (connected to an AC source V) and each of two DC output paths DC1 and DC2 (connected to load L). In particular, rectifying path A is connected between input path AC1 and output path DC1, rectifying path B is connected between input path AC2 and output path DC1, rectifying path C is connected between input path AC1 and output path DC2 and rectifying path D is connected between input path AC2 and output path DC2. Output path DC1 in the circuit of FIG. 1 may be connected to ground G. Each of the four rectifying paths A, B, C and D includes a controllable switch, which may be provided by a cascode circuit of a normally-on transistor and a normally-off transistor. A cascode circuit is basically a two-stage amplifier composed of a transconductance amplifier followed by a current buffer. It can be constructed from two series-connected transistors, with one operating as a common source (or a common emitter) and the other as a common gate (or a common base).

The cascode circuits may employ transistors of a single conductivity type (i.e., p-channel or n-channel field-effect transistors) or transistors of different conductivity types (i.e., p-channel and n-channel field-effect transistors). In the bridge rectifier shown in FIG. 1, rectifying paths A and B include only n-channel field-effect transistors, while rectifying paths C and D include both n-channel and p-channel transistors. In particular, rectifying paths A and B may be identically constructed and may include a normally-off n-channel field-effect transistor Q1 or Q2, whose source line is connected to output path DC1 and whose gate line is connected to the drain line of the respective other transistor Q2 or Q1 (common-gate stage of a cascode circuit). In rectifying path A, the drain line of transistor Q1 is connected to the source line of a normally-on n-channel field-effect transistor Q3, whose gate is coupled to output path DC1 and whose drain line is connected to input path AC1 (common-source stage of a cascode circuit). Accordingly, in rectifying path B, the drain line of transistor Q2 is connected to the source line of a normally-on n-channel field-effect transistor Q4, whose gate is coupled to output path DC1 and whose drain line is connected to input path AC2.

Rectifying paths C and D may also be identically constructed. Rectifying path C may include a normally-off p-channel field-effect transistor Q5, whose drain line is connected to input path AC1 (common-drain stage) and whose gate line is connected to the drain line of transistor Q1 in rectifying path A. A normally-on n-channel field-effect transistor Q7 is connected via its source line to the source line of transistor Q5, via its gate line to input path AC1 and via its drain line to output path DC2 (common-gate stage). Rectifying path D may include a normally-off p-channel field-effect transistor Q6, whose drain line is connected to input path AC2 and whose gate line is connected to the drain line of transistor Q2 in rectifying path B. A normally-on n-channel field-effect transistor Q8 is connected via its source line to the source line of transistor Q6, via its gate line to input path AC2 and via its drain line to output path DC2.

Transistors Q1-Q8 may include internal diode-like structures, referred to as body diodes D1-D8, between respective source lines and drain lines of transistors Q1-Q8, whereby in n-channel transistors Q1-Q4, Q7 and Q8, the anodes of the diode-like structures are coupled to the source lines and the cathodes are coupled to the drain lines. In p-channel transistors Q5 and Q6, the cathodes of body diodes D5 and D6 are coupled to the source lines and their anodes are coupled to the drain lines.

When alternating voltage source V provides a voltage with a positive polarity on input line AC1 and a negative polarity on input line AC2, the potential at the source of transistor Q2 (i.e., in output path DC1) is theoretically more positive than that in input path AC2 by approximately the sum of the forward voltages of body diodes D2 and D4. As transistor Q4 is a normally-on transistor, the actual difference of the potentials may only be around the same value as the forward voltage of body diode D2. The voltage occurring between the source line and drain line of transistor Q2 is rather low so that transistor Q1 receives no relevant gate source voltage and therefore blocks. The voltage between input paths AC1 and AC2 is nearly the same as the voltage between the drain line of normally-on transistor Q3 and the source line of normally-off transistor Q1. In this operating state, both the normally-off transistor Q1 and the normally-on transistor Q3 block and thus divide the voltage between the first input path AC1 and the first output path DC1 at the node between their drain and source lines. The voltage at the drain line of normally-off transistor Q1 also appears between the gate line and source line of normally-off transistor Q2 so that this transistor and the series-connected normally-on transistor Q4 are in a conducting state. In this operating state, the body diodes D2 and D4 are bridged by the conducting drain-source paths of transistors Q2 and Q4, respectively. A current flowing through load L via the first output path DC1 and the input path AC1 may cause a voltage drop between the first output path DC1 and the input path AC1 which is defined by the parallel connection of the body diodes D2 and D4 with the channels of transistors Q2 and Q4, which have ohmic characteristics. The voltage occurring between the drain line and source line of normally-on transistor Q3 is applied inversely to the gate-source path of the normally-off p-channel transistor Q5, which is thus in a conducting state. When normally-off, transistor Q5 is conducting and the series-connected normally-on transistor Q7 is also conducting.

On the other hand, in its conducting state, normally-on transistor Q4 causes the gate voltage of normally-off p-channel transistor Q6 to be low and thus causes transistor Q6 and corresponding series-connected normally-on transistor Q8 to block. Transistors Q6 and Q8 block synchronously with transistors Q1 and Q3 so that the corresponding rectifying paths A and D isolate output paths DC1 and DC2 from input paths AC1 and AC2. In contrast, rectifying paths B and C, which include transistors Q5, Q7, Q2 and Q4, are in an ohmic conducting state so that output paths DC1 and DC2 are switched to paths AC1 and AC2 with only little voltage loss.

When alternating voltage source V provides a voltage with a negative polarity on input line AC1 and a positive polarity on input line AC2, transistors Q2, Q4, Q5 and Q7 (and so the corresponding rectifying paths B and C) are in a blocking state, while transistors Q1, Q3, Q6 and Q8 (and so the corresponding rectifying paths A and D) are in an ohmic conducting state.

In the four-wave rectifier shown in FIG. 1, the drain-source voltage of each transistor directly controls the gate of another transistor. Therefore, all transistors used here may be low-voltage transistors (i.e., transistors with a nominal voltage between 10 and 200 V) if the gates of the normally-on transistors Q3, Q4, Q7 and Q8 and the p-channel transistors Q5 and Q6 feature highly blocking gate oxides. For example, full-wave rectifiers in power supply applications have blocking capabilities of about 800 V to avoid severe damage due to peak voltages that may occur in a 230 V/50 Hz power grid by passing voltage peaks and corresponding current peaks to an intermediate stage capacitor for attenuation. In order to achieve the necessary blocking capabilities, transistors Q1, Q3, Q5 and Q7 may feature asymmetric blocking capabilities. For example, transistors Q1 and Q5 may have a nominal blocking voltage between 30 and 200 V, while transistors Q3 and Q7 can each withstand differential voltages of about 800 V. A higher reverse voltage of the normally-on transistors can be achieved, for example, by means of transistors with blocking voltages of 700-800 V or by series connection of a multiplicity of normally-on transistors with lower reverse voltages.

Figure 2:
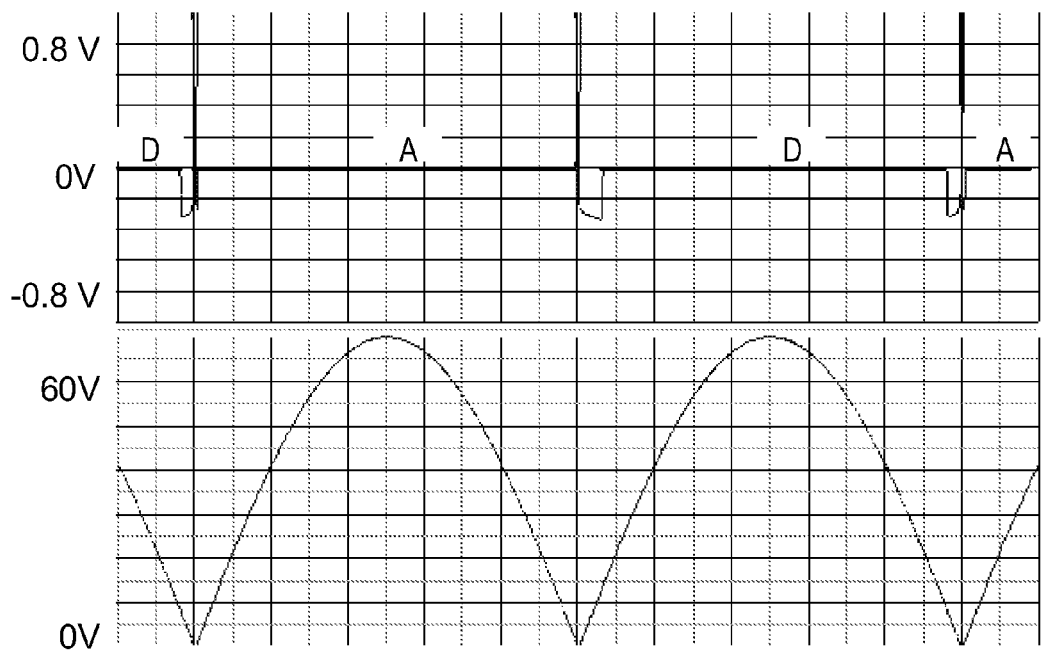
FIG. 2 is a diagram illustrating simulation results of the full-wave rectifier shown in FIG. 1.

FIG. 2 is a diagram depicting simulation results of the rectifier shown in FIG. 1 operated with an alternating input voltage of about 70 V. The top part of FIG. 2 shows in detail the voltage over time at rectifying paths A, C or B, D linked to the same input path AC1 or AC2, whereby the blocking voltage is clipped off in the representation of FIG. 2 for the sake of improved presentability. The bottom part of FIG. 2 shows the full-wave rectified voltage over time at load L. It should be noted that at the signal crossing of the input voltage, the body diodes of transistors Q6 (paths C and D) or Q2 (paths A and B) are initially active before the input voltage is high enough to switch transistors Q2 and Q6 into an ohmic conductive state with low voltage drop. Because of the current flow through the respective body diode, slightly increased power loss may temporarily occur. Through selection of the starting voltage of the normally-off transistors, the losses can be minimized. However, in most power supply applications a power factor correction which enables a current to flow on the AC input lines is used. This current is also sinusoidal and in phase with a sinusoidal AC line voltage so that during and close to the zero crossing of the AC line voltage the line current flowing through the full wave rectifier is also low. This helps to minimize the losses even when the current flows through the body diodes for a short period of time. No such minimization has been applied in the rectifier that forms the basis for the diagrams shown in FIG. 2.

Figure 3:
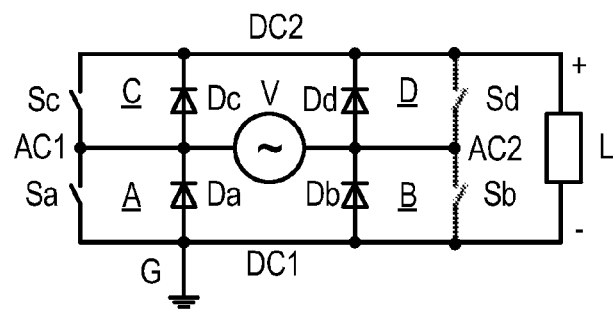
FIG. 3 is a simplified equivalent circuit diagram of the full-wave rectifier shown in FIG. 1.

FIG. 3 is a simplified equivalent circuit diagram of the full-wave rectifier shown in FIG. 1. Alternating voltage source V is connected via a diode bridge with diodes Da, Db, Dc and Dd to load L. Diodes Da, Db, Dc and Dd may be representative of the body diodes D1-D8 of transistors Q1-Q8. Each of the diodes Da, Db, Dc and Dd comprises a bypass switch Sa, Sb, Sc or Sd, whereby switches Sa, Sb, Sc and Sd are formed by the corresponding cascode circuits with transistors Q1-Q8. Accordingly, each rectifying path A, B, C and D includes a parallel connection of a switch Sa, Sb, Sc or Sd and a diode Da, Db, Dc or Dd. For example, switches Sa, Sb, Sc and Sd and thus the corresponding rectifying paths A, B, C and D may connect input path AC1 to output path DC1 and input path AC2 to output path DC2 during one half wave of the input voltage, and they may connect input path AC1 to output path DC2 and input path AC2 to output path DC1 during the other half wave of the input voltage.

Figure 4:
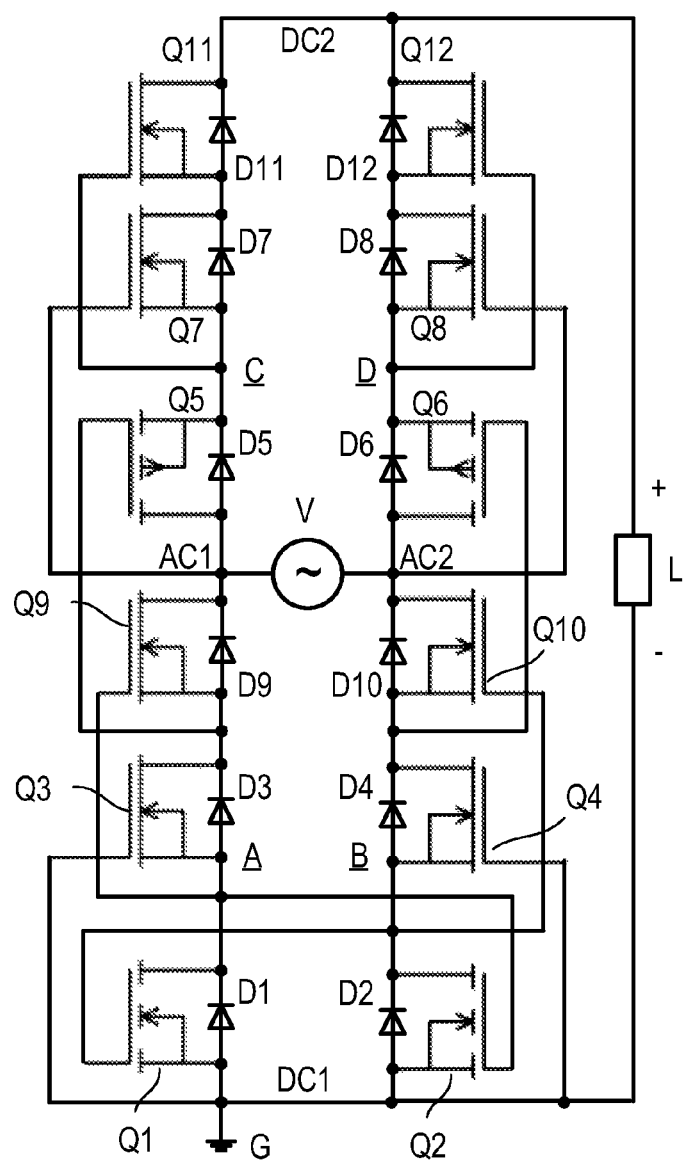
FIG. 4 is circuit diagram of a full-wave rectifier with three transistors in each rectifying path.

Referring to FIG. 4, the full-wave rectifier shown in FIG. 1 may be enhanced by adding another normally-on field-effect transistor Q9, Q10, Q11 and Q12 to each of the rectifying paths. In particular, the source-drain path of transistor Q9 is connected between the drain line of transistor Q3 and input path AC1. The gate line of transistor Q9 is connected to the source line of transistor Q3. The source-drain path of transistor Q10 is connected between the drain line of transistor Q4 and input path AC2. The gate line of transistor Q10 is connected to the source line of transistor Q4. Correspondingly, the source-drain paths of transistors Q11 and Q12 are connected between the drain lines of transistors Q7 and Q8, respectively, and output path DC2. The gate lines of transistors Q11 and Q12 are connected to the source lines of transistors Q7 and Q8, respectively. In the four-wave rectifier shown in FIG. 4, additional (e.g., normally-on n-channel) transistors are used to increase the blocking capabilities in each of the rectifying paths A and B. Correspondingly, additional normally-on n-channel transistors are included in paths C and D for the same reason. Transistors Q11 and Q12 include body diodes D11 and D12 between the source line and drain line, as in, for example, transistors Q7 and Q8.

Figure 5:
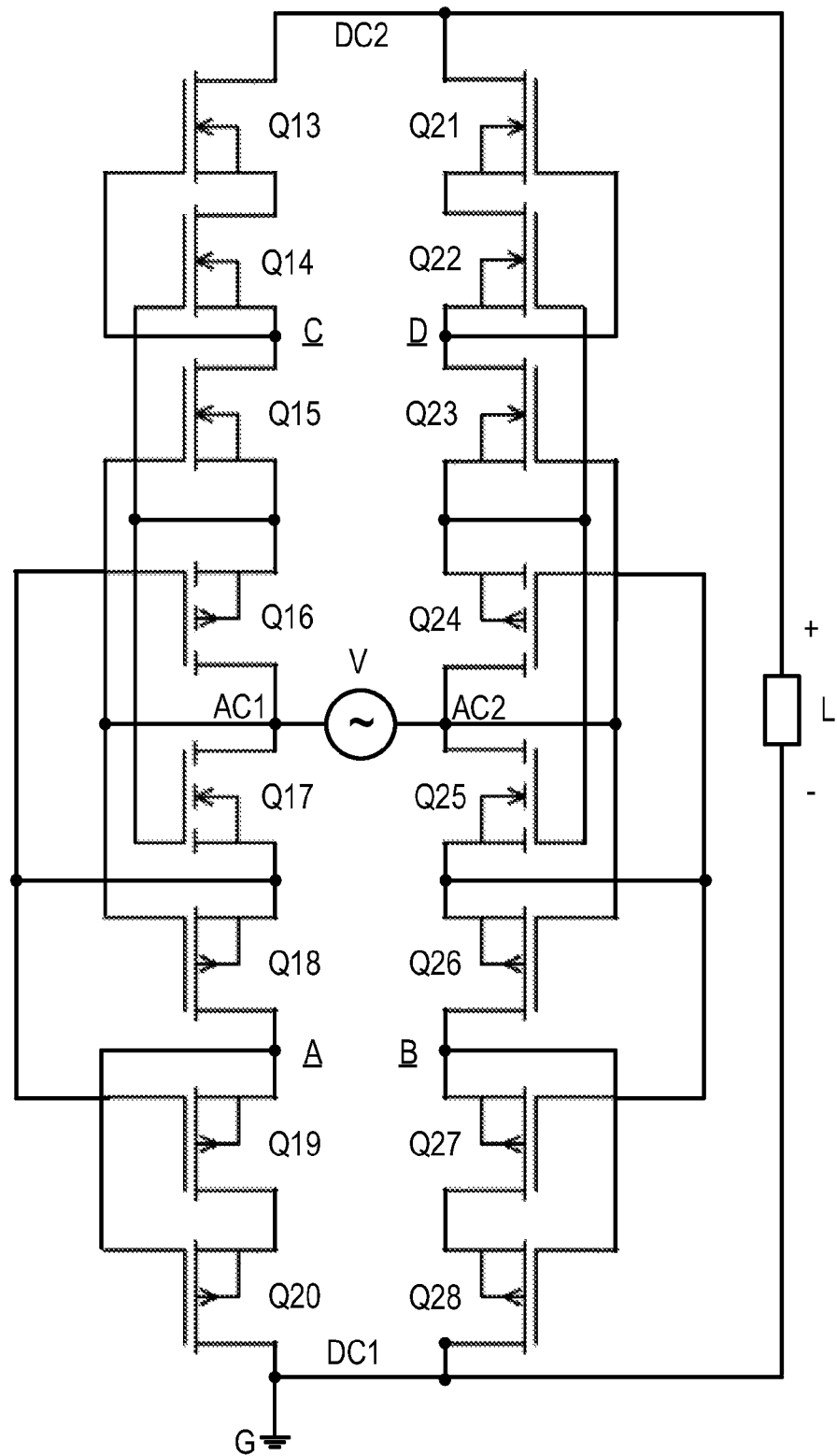
FIG. 5 is circuit diagram of a full-wave rectifier with four transistors in each rectifying path.

An alternative full-wave rectifier may employ a multiplicity normally-on p- and n-channel transistors in connection with normally-off p- and n-channel transistors, as shown in FIG. 5. The alternative structure of a full-wave rectifier may include in rectifying path A from output path DC1 to input path AC1 a drain-source path of normally-on p-channel field-effect transistor Q20, a drain-source path of normally-on p-channel field-effect transistor Q19, a drain-source path of normally-on p-channel field-effect transistor Q18 and a source-drain path of a normally-off n-channel field-effect transistor Q17. A gate line of normally-on field-effect transistor Q20 is connected to the source line of normally-on field-effect transistor Q19. A gate line of normally-on field-effect transistor Q19 is connected to the source line of normally-onfield-effect transistor Q18, whose gate line is connected to input path AC1.

Rectifying path B extends from output path DC1 to input path AC2 through a drain-source path of normally-onp-channel field-effect transistor Q28, a drain-source path of normally-onp-channel field-effect transistor Q27, a drain-source path of normally-onp-channel field-effect transistor Q26 and a source-drain path of normally-off n-channel field-effect transistor Q25. A gate line of normally-onfield-effect transistor Q28 is connected to the source line of normally-onfield-effect transistor Q27, a gate line of which is connected to the source line of normally-onfield-effect transistor Q26. A gate line of normally-onfield-effect transistor Q26 is connected to input path AC2.

Rectifying path C extends from input path AC1 to output path DC2 through a drain-source path of normally-off p-channel field-effect transistor Q16, a drain-source path of normally-onn-channel field-effect transistor Q15, a source-drain path of normally-onn-channel field-effect transistor on and a source-drain path of normally-onn-channel field-effect transistor Q13. A gate line of normally-off field-effect transistor Q16 is connected to the source line of normally-off field-effect transistor Q17 of rectifying path A. A gate line of normally-onfield-effect transistor Q15 is connected to input path AC1. A gate line of normally-onfield-effect transistor Q14 is connected to the source line of normally-onfield-effect transistor Q15 and the gate line of normally-onfield-effect transistor Q17. A gate line of normally-onfield-effect transistor 13 is connected to the source line of transistor Q14.

Rectifying path D extends from input path AC2 to output path DC2 through a drain-source path of normally-off p-channel field-effect transistor Q24, a source-drain path of normally-onn-channel field-effect transistor Q23, a source-drain path of normally-onn-channel field-effect transistor Q22 and a source-drain path of normally-onn-channel field-effect transistor Q21. A gate line of normally-off field-effect transistor Q24 is connected to the source line of normally-onfield-effect transistor Q25. A gate line of normally-onfield-effect transistor Q23 is connected to input path AC1. A gate line of normally-onfield-effect transistor Q22 is connected to the source line of normally-onfield-effect transistor Q23 and a gate line of normally-onfield-effect transistor Q25 of rectifying path B. A gate line of normally-onfield-effect transistor Q21 is connected to the source line of transistor Q22.

The full-wave rectifiers described above may be applicable in connection with ohmic loads or subsequent buck and/or boost converters such as power factor controllers. For example, in a power factor controller, the intermediate stage capacitor is uncoupled from the input (full-wave) rectifier and an inductor by a buck/boost diode so that there is no reverse current flowing from the intermediate stage capacitor to the input (e.g., the power grid), which would otherwise be the case when applying a capacitive load directly.

The full-wave rectifiers described above have a bridge-like structure with cascode circuits whose load paths form the rectifying paths. Cascode circuits sharing the same input path and/or cascode circuits sharing ground (corresponding to one of the output paths) may be cross-coupled with each other via the cascode circuit inputs and intermediate outputs of the cascode circuits. The cascode circuits may employ transistors of only a single conductivity type or of both types, e.g., only p-channel transistors, only n-channel transistors or both. The transistors in the cascodes may be of the normally-on type or the normally-off type due to their function within the cascode circuit. For example, the normally-on transistors may be used to increase the proof voltage, and the (cross-coupled) normally-off transistors may be used to control switching off the rectifier. The number of transistors per rectifying path in the above examples is 2, 3 or 4 but may be likewise any number higher than 4.

While various embodiments of the invention have been described, it will be apparent to those of ordinary skill in the art that many more embodiments and implementations are possible within the scope of the invention.

What is claimed is:

1. A full-wave rectifier comprising:
two input paths configured to receive an alternating input voltage;
two output paths configured to provide a direct output voltage; and
four switched-mode rectifying paths that are connected between each of the input paths and each of the output paths, wherein
the switched-mode rectifying paths are configured to connect a first input path to a first output path and a second input path to a second output path during a first half wave of the input voltage, and to connect the first input path to the second output path and the second input path to the first output path during a second half wave of the input voltage, wherein
each of the four switched-mode rectifying paths comprises two series-connected transistors, and wherein, in a first and a second switched-mode rectifying path of the four switched-mode rectifying paths, the two series-connected transistors form a cascode circuit with a first normally-off transistor and a first normally-on transistor,
in the first and the second switched-mode rectifying paths, source lines of the first normally-off transistors in the first and the second switched-mode rectifying paths are connected to the same output path, and
gate lines of the first normally-off transistors in the first and the second-switched mode rectifying paths are coupled with drain lines of the first normally-off transistor in the respective other of the first and second rectifying path.

2. The full-wave rectifier of claim 1, wherein the first normally-off transistor and the first normally-on transistor in each cascode circuit are of the same conductivity type.

3. The full-wave rectifier of claim 2, wherein, in the first and the second switched-mode rectifying paths,
the first normally-off transistors and the first normally-on transistors are field-effect transistors with gate, source and drain lines;
the cascode circuits each comprise a series connection of a common-source stage and a common-gate stage;
the first normally-off transistors are configured to be the common-source stages of the cascode circuits; and
the first normally-on transistors are configured to be the common-gate stages of the cascode circuits.

4. The full-wave rectifier of claim 1, wherein in a second and a third switched-mode rectifying path of the four switched-mode rectifying paths, the two series-connected transistors form a second cascade circuit with a second normally-off transistor and a second normally-on transistor, wherein the second normally-off transistor and the second normally-on transistor in each cascode circuit are of different conductivity types.

5. The full-wave rectifier of claim 4, wherein, in the first and second switched-mode rectifying paths,
the first normally-off transistors and the first normally-on transistors are field-effect transistors with gate, source and drain lines;
the cascode circuits each comprise a series connection of a common-drain stage and a common-gate stage;
the first normally-off transistors are configured to be the common-drain stages of cascode circuits; and
the first normally-on transistors are configured to be the common-gate stages of the cascode circuits.

6. The full-wave rectifier of claim 5, wherein, in the first and second switched-mode rectifying paths,
the drain line of the first normally-off transistor in one of the first and second switched-mode rectifying paths and the drain line of the first normally-on transistor in the other of the first and second rectifying paths are connected to the same input path; and
the gate line of the first normally-off transistor in the common-drain stage of the cascade circuit in one of the first and second rectifying paths is coupled with the source line of the first normally-on transistor of the common-gate stage in the other of the first and second switched-mode rectifying paths.

7. The full-wave rectifier of claim 1, wherein, in the first and second switched-mode rectifying paths, each switched-mode rectifying path further comprises a second normally-on transistor, the first normally-off transistor and the first and second normally-on transistors in each cascade circuit being of the same conductivity type.

8. The full-wave rectifier of claim 7, wherein, in the first and second switched-mode rectifying paths,
the first normally-off transistors and the first and second normally-on transistors of the same conductivity type are field-effect transistors with gate, source and drain lines;
the cascode circuits each comprise a series connection of a common-source stage and two common-gate stages;
the first normally-off transistors are configured to be the common-source stages of the cascode circuits; and
the first and second normally-on transistors are configured to be the common-gate stages of the cascode circuits.

9. The full-wave rectifier of claim 8, wherein, the first and second switched-mode rectifying paths,
the source lines of the first normally-off transistors in the first and second switched-mode rectifying paths are connected to the same output path; and
the gate lines of the first and second normally-off transistors in the first and second switched-mode rectifying paths are coupled with the drain lines of the first normally-off transistor in the respective other of the first and second switched-mode rectifying paths.

10. The full-wave rectifier of claim 1, wherein, in the first and second switched-mode rectifying paths, each of the first and second rectifying paths further comprises a second normally-on transistor, the first normally-off transistor being of a different conductivity type than the first and second normally-on transistors.

11. The full-wave rectifier of claim 10, wherein, in the first and second switched-mode rectifying paths,
the first normally-off transistor and the first and second normally-on transistors are field-effect transistors with gate, source and drain lines;
the cascode circuits each comprise a series connection of a common-drain stage and two common-gate stages;
the first normally-off transistors are configured to be common-drain stages of the cascode circuits; and
the first and second normally-on transistors are configured to be the common-gate stages of the cascode circuits.

12. The full-wave rectifier of claim 11, wherein, in the first and second switched-mode rectifying paths,
the drain line of the first normally-off transistor in one of the first and second switched-mode rectifying paths and the drain line of the first and second normally-on transistors in the other of the first and second rectifying paths are connected to the same input path; and
the gate line of the first normally-off transistor in the common-drain stage of one cascode circuit in one of the first and second rectifying paths is coupled with the source line of the first and second normally-on transistors of the common-gate stage in the other of the first and second rectifying paths.

13. The full-wave rectifier of claim 1, wherein the at least first and second switched-mode rectifying paths each comprise a cascode circuit with at least four normally-off or four normally-on transistors, three of which being of the same conductivity type and one being of another conductivity type.

14. The full-wave rectifier of claim 13, wherein, in the at least first and second switched-mode rectifying paths,
the normally-off or normally-on transistors are field-effect transistors with gate, source and drain lines; and
the cascode circuits each comprise a series connection of a common-drain stage and three common-gate stages.

15. The full-wave rectifier of claim 14, wherein, in the at least first and second switched-mode rectifying paths,
the drain lines of the normally-off or normally-on transistors that are configured to be the common-gate stage are connected to the same output path, and
the drain lines of the normally-off or normally-on transistors that are configured to be the common-drain stages of the cascode circuits in each switched-mode rectifying path are series connected to different input paths.

16. The full-wave rectifier of claim 1, wherein the cascode circuits share the same input paths or the cascode circuits share a certain output path, and wherein the cascode circuits are cross-coupled with each other.

17. A full-wave rectifier comprising:
a first and a second input path configured to receive an alternating input voltage;
a first and a second output path configured to provide a direct output voltage;
a first switched-mode rectifying path from the first output path to the first input path through a source-drain path of a first normally-off field-effect transistor of a first conductivity type and a source-drain path of a first normally-on field-effect transistor of the first conductivity type, where a gate line of the first normally-on field-effect transistor is connected to the first output path;
a second switched-mode rectifying path from the first output path to the second input path through a source-drain path of a second normally-off field-effect transistor of the first conductivity type and a source-drain path of a second normally-on field-effect transistor of the first conductivity type, where a gate line of the second normally-on field-effect transistor is connected to the first output path, a gate line of the second normally-off field-effect transistor is connected to a source line of the first normally-off field-effect transistor and a source line of the second normally-off field-effect transistor is connected to the gate line of the first normally-off field-effect transistor;
a third switched-mode rectifying path from the first input path to the second output path through a drain-source path of a third normally-off field-effect transistor of a second conductivity type and a source-drain path of a third normally-on field-effect transistor of the first conductivity type, where a gate line of the third normally-on field-effect transistor is connected to the first input path and a gate line of the third normally-off field-effect transistor is connected to a drain line of the first normally-off field-effect transistor; and
a fourth switched-mode rectifying path from the second input path to the second output path through a drain-source path of a fourth normally-off field-effect transistor of the second conductivity type and a source-drain path of a fourth normally-on field-effect transistor of the first conductivity type, where a gate line of the fourth normally-on field-effect transistor is connected to the second input path and a gate line of the third normally-off field-effect transistor is connected to a drain line of the second normally-off field-effect transistor.

18. A full-wave rectifier comprising:
a first and a second input path configured to receive an alternating input voltage;
a first and a second output path configured to provide a direct output voltage;
a first switched-mode rectifying path from the first output path to the first input path through a source-drain path of a first normally-off field-effect transistor of a first conductivity type, a source-drain path of a first normally-on field-effect transistor of the first conductivity type and a source-drain path of a fifth normally-on field-effect transistor of the first conductivity type, where a gate line of the first normally-on field-effect transistor is connected to the first output path and a gate line of the fifth normally-on field-effect transistor is connected to a drain line of the first normally-off field-effect transistor;
a second switched-mode rectifying path from the first output path to the second input path through a source-drain path of a second normally-off field-effect transistor of the first conductivity type, a source-drain path of a second normally-on field-effect transistor of the first conductivity type and a source-drain path of a sixth normally-on field-effect transistor of the first conductivity type, where a gate line of the second normally-on field-effect transistor is connected to the first output path, a gate line of the second normally-off field-effect transistor is connected to a source line of the first normally-off field-effect transistor, a source line of the second normally-off field-effect transistor is connected to the gate line of the first normally-off field-effect transistor and a gate line of the sixth normally-on field-effect transistor is connected to a drain line of the second normally-off field-effect transistor;
a third switched-mode rectifying path from the first input path to the second output path through a drain-source path of a third normally-off field-effect transistor of a second conductivity type, a source-drain path of a third normally-on field-effect transistor of the first conductivity type and a source-drain path of a seventh normally-on field-effect transistor of the first conductivity type, where a gate line of the third normally-on field-effect transistor is connected to the first input path, a gate line of the third normally-off field-effect transistor is connected to the source line of the fifth normally-on field-effect transistor and a gate line of the seventh normally-on field-effect transistor is connected to the source line of the third normally-off field-effect transistor; and
a fourth switched-mode rectifying path from the second input path to the second output path through a drain-source path of a fourth normally-off field-effect transistor of the second conductivity type, a source-drain path of a fourth normally-on field-effect transistor of the first conductivity type and a source-drain path of an eighth normally-on field-effect transistor of the first conductivity type, where a gate line of the fourth normally-on field-effect transistor is connected to the second input path, a gate line of the third normally-off field-effect transistor is connected to the source line of the sixth normally-on field-effect transistor and a gate line of the eighth normally-on field-effect transistor is connected to the source line of the fourth normally-off field-effect transistor.

19. A full-wave rectifier comprising:
a first and a second input path configured to receive an alternating input voltage;
a first and a second output path configured to provide a direct output voltage;
at least one first switched-mode rectifying path from the first output path to the first or second input path through a drain-source path of a first normally-on field-effect transistor of a second conductivity type, a drain-source path of a second normally-on field-effect transistor of the second conductivity type, a drain-source path of a third normally-on field-effect transistor of the second conductivity type and a source-drain path of first normally-off field-effect transistor of a first conductivity type, where a gate line of the first normally-on field-effect transistor is connected to a source line of the second normally-on field-effect transistor, a gate line of the second normally-on field-effect transistor is connected to a source line of the third normally-on field-effect transistor and a gate line of the third normally-on field-effect transistor is connected to the first or second input path; and at least one second switched-mode rectifying path from the first or second input path to the second output path through a drain-source path of a second normally-off field-effect transistor of the second conductivity type, a drain-source path of a fourth normally-on field-effect transistor of the first conductivity type, a drain-source path of a fifth normally-on field-effect transistor of the first conductivity type and a source-drain path of a sixth normally-on field-effect transistor of the first conductivity type, where a gate line of the second normally-off field-effect transistor is connected to the source line of the third normally-on field-effect transistor, a gate line of the fourth normally-on field-effect transistor is connected to the first or second input path, a gate line of the fifth normally-on field-effect transistor is connected to a source line of the fourth normally-on field-effect transistor and the gate line of the sixth normally-on field-effect transistor is connected to a source line of the fifth normally-on field-effect transistor.

* * * * *